United States Patent [19]
Forbes

[11] Patent Number: 5,835,403
[45] Date of Patent: *Nov. 10, 1998

[54] MULTIPLICATION OF STORAGE CAPACITANCE IN MEMORY CELLS BY USING THE MILLER EFFECT

[75] Inventor: Leonard Forbes, Corvallis, Oreg.

[73] Assignee: Micron Technology, Inc., Boise, Id.

[*] Notice: The term of this patent shall not extend beyond the expiration date of Pat. No. 5,666,306.

[21] Appl. No.: 879,908

[22] Filed: Jun. 20, 1997

Related U.S. Application Data

[63] Continuation of Ser. No. 706,662, Sep. 6, 1996, Pat. No. 5,666,306.

[51] Int. Cl.[6] ................................................... G11C 11/24
[52] U.S. Cl. ........................................ 365/149; 365/203
[58] Field of Search ..................................... 365/149, 203

[56] References Cited

U.S. PATENT DOCUMENTS

| | | | |
|---|---|---|---|
| 4,970,689 | 11/1990 | Kenney | 365/189.01 |
| 4,999,811 | 3/1991 | Banerjee | 365/149 |
| 5,066,607 | 11/1991 | Banerjee | 437/52 |
| 5,220,530 | 6/1993 | Itoh | 365/189.01 |
| 5,448,513 | 9/1995 | Hu et al. | 365/150 |
| 5,483,482 | 1/1996 | Yamada et al. | 365/149 |
| 5,684,735 | 11/1997 | Kim | 365/149 |

OTHER PUBLICATIONS

Cottrell, P., et al., "N–Well Design for Trench DRAM Arrays", *IEEE*, Abstract of Int. Electron Device Meeting, pp. 584–587, (1988).

Ema, T., et al., "3–Dimensional Stacked Capacitor Cell for 16M and 64M DRAMs", *IEDM*, Abstract of Int. Electron Device Meeting, pp. 592–595, (1988).

Mize, J.P., et al., "Semiconductor Memory Design and Applications", McGraw–Hill New York, pp. 115–138, (1973).

*Primary Examiner*—Son T. Dinh
*Attorney, Agent, or Firm*—Schwegman, Lundberg, Woessner & Kluth, P.A.

[57] ABSTRACT

A memory cell for a dynamic random access memory includes a storage transistor that is connected for operation as an amplifier, the drain-to-gate capacitance of the storage transistor functioning as the storage capacitance for the memory cell. An access transistor is interposed between a bit line and the input of the amplifier, for coupling the amplifier to the bit line during write and read operations for the memory cell. During memory cell read operations, the storage capacitance is effectively multiplied by 1+Av, where Av is the gain of the amplifier, providing Miller-effect amplification of the storage capacitance.

13 Claims, 3 Drawing Sheets

MULTIPLICATION OF STORAGE CAPACITANCE IN MEMORY CELLS BY USING THE MILLER EFFECT

"This application is a continuation of U.S. patent application Ser. No. 08/706,662, filed Sep. 6, 1996," now U.S. Pat. No. 5,666,306.

FIELD OF THE INVENTION

The present invention relates generally to dynamic random access memory devices, and in particular, the present invention relates to a method and memory cell structure for increasing the amplitude of the output signal provided by memory cells of dynamic random access memory devices by using the Miller effect.

BACKGROUND OF THE INVENTION

The memory cells of dynamic random access memories (DRAMs) are comprised of two main components, a field-effect transistor (FET) and a capacitor which functions as a storage element. The need to increase the storage capability of semiconductor memory devices has led to the development of very large scale integrated (VLSI) cells which provides a substantial increase in component density. As component density has increased, cell capacitance has had to be decreased because of the need to maintain isolation between adjacent devices in the memory array. However reduction in memory cell capacitance reduces the electrical signal output from the memory cells, making detection of the memory cell output signal more difficult. Thus, as the density of DRAM's increases, it becomes more and more difficult to obtain reasonable storage capacity.

In order to meet the high density requirements of very large scale integrated cells in DRAM cells, some manufacturers are utilizing DRAM memory cell designs based on non-planar capacitor structures, such as complicated stacked capacitor structures and deep trench capacitor structures. Although non-planar capacitor structures provide increased cell capacitance, such arrangements create other problems that effect performance of the memory cell. For example, trench capacitors are fabricated in trenches formed in the semiconductor substrate, the problem of trench-to-trench charge leakage caused by the parasitic transistor effect between adjacent trenches is enhanced. Moreover, the alpha-particle component of normal background radiation can generate hole-electron pairs in the silicon substrate which functions as one of the storage plates of the trench capacitor. This phenomena will cause a charge stored within the affected cell capacitor to rapidly dissipate, resulting in a soft error.

Another technique that has been used, commonly referred to as the three-transistor cell, uses transistors for gain input multipliers driving the output data or bit line. The transistors function as simple voltage amplifiers. A significant shortcoming of this arrangement is the requirement for additional lines to the memory cell, which is a serious disadvantage, particularly in high density memory structures.

Another approach has been to provide DRAM cells with dynamic gain, commonly referred to as gain cells. For example, U.S. Pat. No. 5,220,530 discloses a two-transistor gain-type dynamic random access memory cell. The memory cell includes two field-effect transistors, one of the transistors functioning as write transistor and the other transistor functioning as a data storage transistor. The storage transistor is capacitively coupled via an insulating layer to the word line to receive substrate biasing by capacitive from the read word line. This gain cell arrangement requires two write lines and a separate read line.

For the reasons stated above, and for other reasons stated below which will become apparent to those skilled in the art upon reading and understanding the present specification, there is a need in the art for a dynamic random access memory cell which is characterized by an output signal of increased amplitude which is easier to detect

SUMMARY OF THE INVENTION

The present invention provides a memory cell fabricated in a semiconductor memory device, such as a dynamic random access memory. The memory cell includes a storage transistor that is connected for operation as an amplifier, the drain-to-gate capacitance of the storage transistor functioning as the storage capacitance for the memory cell. An access transistor is interposed between a bit line and the input of the amplifier, for coupling the amplifier to the bit line during write and read operations for the memory cell. During memory cell read operations, the storage capacitance is effectively multiplied by one plus the gain of the amplifier, providing Miller-effect amplification of the storage capacitance. Utilization of this storage node capacitance multiplication allows much smaller physical dimensions for storage node capacitances, resulting in much higher density memories.

In accordance with another aspect of the invention, there is provided a method for reading data from a memory cell of a dynamic random access memory device wherein the memory cell includes a storage capacitance. The method includes precharging a bit line to a read voltage level and coupling the storage capacitance to the precharged bit line to cause a current to flow through the storage capacitance. The current flowing through the storage current capacitance in response to the precharge voltage is amplified, and the amplified current is used to discharge the bit line when the memory cell is storing a logic bit at a first logic level and to further charge the bit line when the memory cell is storing a logic bit at a second level.

DESCRIPTION OF THE PREFERRED EMBODIMENT

In the following detailed description of the preferred embodiment, reference is made to the accompanying drawings which form a part hereof, and in which is shown by way of illustration a specific preferred embodiment in which the invention may be practiced. The preferred embodiment is described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the appended claims.

Figure 1:
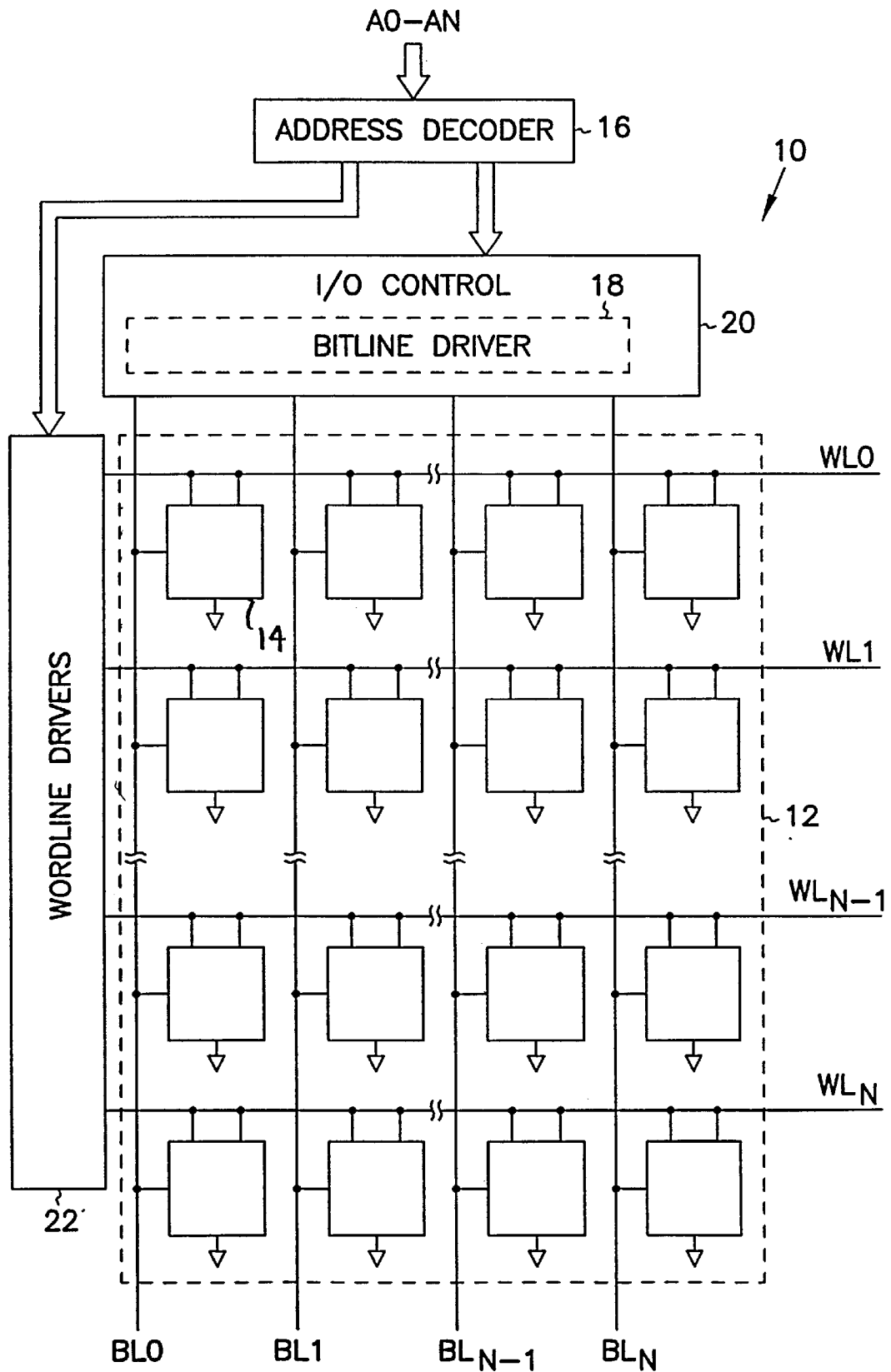
FIG. 1 is a representation of a semiconductor memory device including a matrix of the memory cells provided by the invention.

FIG. 1 is a representation of a semiconductor memory device 10 including a matrix or array 12 of the memory cells, such as memory cell 14, provided by the invention. The semiconductor memory device is a dynamic random access memory (DRAM). The basic memory device 10 is well known in the art to include a memory array 12 constructed of rows and columns of memory cells having inputs and outputs corresponding to rows and columns. In the example, the array has N rows and N columns with bit (data) lines BL0, BL1 . . . $BL_{N-1}$, $BL_N$, and word (address) lines WL0, WL1 . . . $WL_{N-1}$, $WL_N$. The bit lines BL0–$BL_N$ are used to write information into the memory cell and to read data stored in the memory cell. The word lines WL0–WLN are used to address or select the memory cell to which data is to be written or read. Address decoder circuits 16 control bit line drivers 18, which comprise a portion of input/output control circuits 20, and word line drivers 22 to access the memory cells of the memory array 12 in response to address signals A0–AN that are provided by an external controller (not shown), such as a standard microprocessor. The input/output control circuits 20 control synchronous or asynchronous data communication between the memory device 10 and external devices.

Figure 2:
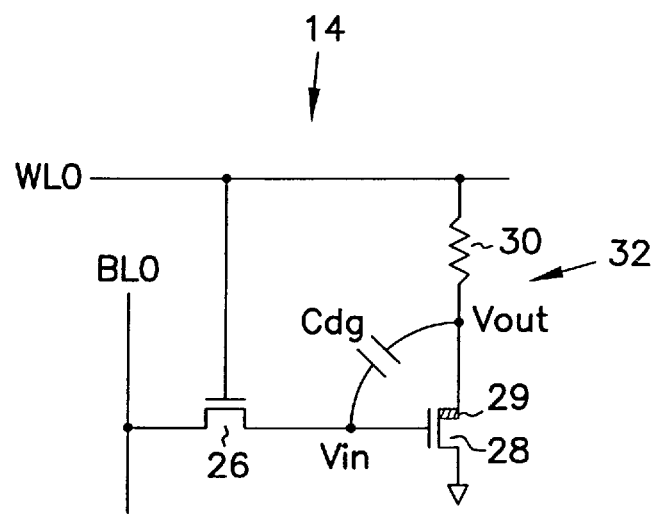
FIG. 2 is a schematic circuit diagram of a memory cell of the memory device of FIG. 1.

All of the memory cells of the memory array are the identical, and accordingly, only one memory cell is described herein. Referring to FIG. 2, each memory cell of the matrix of FIG. 1, such as memory cell 14, includes an n-channel field-effect transistor 26, an n-channel field-effect transistor 28 and a load resistor 30. For memory cell 14, transistor 26 has a source electrode connected to bit line BL0, forming a bit line region for the cell, a gate electrode connected to word line WL0, forming a word line region for the cell, and a drain electrode connected to the gate of transistor 28. Transistor 28 has a source electrode connected to ground. The resistor 30 couples the drain electrode of the transistor 28 to word line WL0. The transistor 28 and the resistor 30 form an amplifier circuit which is indicated generally by the reference numeral 32.

Transistor 26 functions as an access transistor for coupling the bit line BL0 to the gate electrode of transistor 28 during write and read operations when memory cell 14 is addressed. The word lines, such as word line WL0, are used to address the memory cells, such as memory cell 14, by turning on the access transistor 26 and also to activate the amplifier circuit 32.

The drain-to-gate capacitance $C_{dg}$ of transistor 28 functions as the storage node capacitor for the memory cell 14, and thus, transistor 28 is referred to herein as the storage transistor of the memory cell. The invention uses the Miller effect multiplication of this storage node capacitance to increase the output signal provided by the memory cell. The voltage gain $A_v$ of the amplifier circuit 32 is given by the relationship:

$$A_v = gmR \qquad (1)$$

where gm is the transconductance of the storage transistor 28, and R is the value of the load resistor 30. The drain-to-gate capacitance $C_{dg}$ of storage transistor 28 is been designed to be larger than normal. The amplifier circuit further amplifies the capacitance by values of up to an order of magnitude or larger. The capacitance Cref reflected into the input of the amplifier circuit 32 is given by the relationship:

$$Cref = C_{dg}(1+A_v) \qquad (2)$$

The capacitance of the amplifier circuit 32 is increased by the magnitude of the capacitance between the input node and the output node multiplied by the gain of the amplifier circuit.

Transistor 28 can be fabricated as a transistor in a trench and the resistor 30 can be a polysilicon plug on the drain connecting the drain of the transistor 28 to the word line WL0. The drain-to-gate capacitance of transistor 28 is made larger by causing the gate region to overlap the drain region. This is represented by the shaded area 29 on the transistor 28 shown in FIG. 2. This can be done using conventional metal technology in fabricating the memory device.

In the exemplary embodiment, three voltages are used to write data into the memory cell 14 and read the data stored in the memory cell. These voltages include a write voltage Vx+Vt for storing or writing a logic "1" level bit; a write voltage 2Vx+Vt for storing a logic "0" level bit, and a read voltage 1.5Vx+Vt The read voltage level is intermediate the levels of the two write voltages. The voltage Vx is any suitable voltage level and, for example, can be about one-half the supply voltage Vdd. The voltage Vt is the threshold voltage for the transistors 26 and 28 at which the transistors turnon or begin conducting. The memory cell is designed such that, for a supply voltage Vdd, and when the input voltage Vin is equal to Vx+Vt, the voltage Vout, provided at the output of the amplifier at the drain of the transistor 28 is also equal to Vx+Vt.

Note that the designation of storing a logic "1" level bit and storing a logic "0" level bit is arbitrary. An "uncharged" condition for the memory cell can represent either a stored logic "1" level bit or a stored logic "0" level bit, with the charged condition representing the complementary condition, i.e., a stored logic "0" level bit or a stored logic "1" level bit, respectively.

Figure 3A:
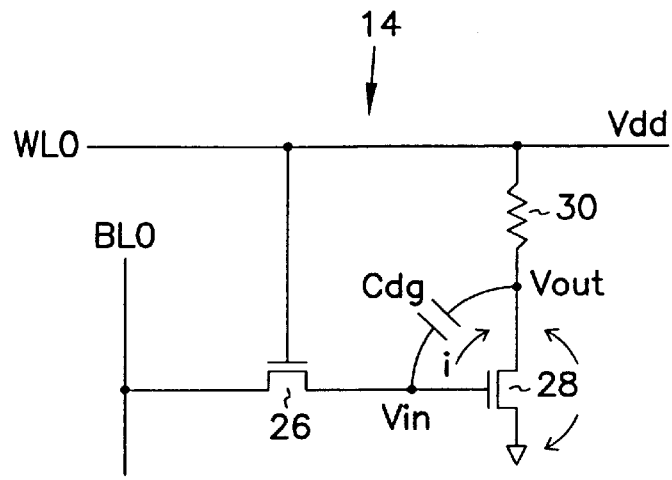
FIGS. 3A–3C are schematic circuit diagrams showing the operation of the memory cell shown in FIG. 2.

Referring to FIG. 3A, to store a logic "1" level bit in the memory cell 14, the bit line BL0 is held to the write voltage Vx+Vt and the memory cell is addressed by raising the word line WL0 to the supply voltage Vdd. Because the output voltage is Vx+Vt, and thus is equal to the input voltage Vin, the storage node capacitor $C_{dg}$ remains uncharged.

To store a logic "0" level bit in the memory cell 14, the bit line BL0 is held at the write voltage 2Vx+Vt. The memory cell is addressed by raising the word line WL0 to the supply voltage Vdd. When the memory cell is addressed, the write voltage 2Vx+Vt turns transistor 28 on hard. The voltage Vout provided at the output of the amplifier goes low towards ground or zero volts, and the storage node capacitor is charged to a voltage near 2Vx+Vt. When the write voltage 2Vx+Vt is applied to the bit line BL0, the gain of the memory cell 14 is lower than in the previous configuration wherein the write voltage Vx+Vt is applied to the bit line BL0.

Figure 3B:
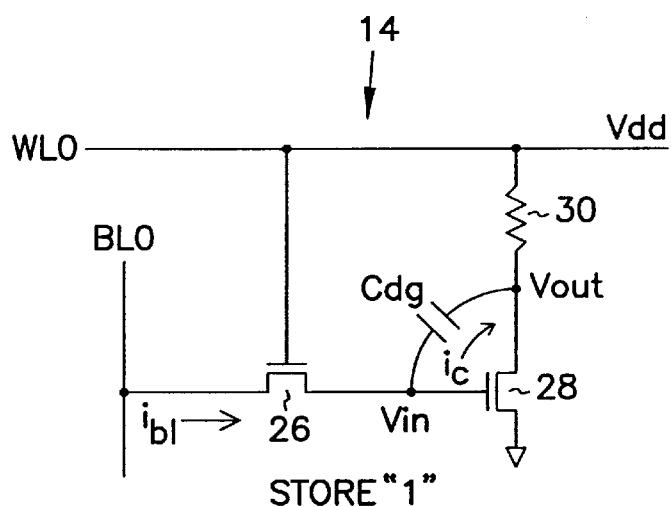

Referring to FIG. 3B, for a read operation, the bit line BL0 is precharged to the read voltage 1.5Vx+Vt. When the memory cell 14 is addressed or activated by the word line WL0 becoming positive Vdd, the access transistor 26 turns on, coupling the bit line BL0 to the gate of the storage transistor 28. When a logic "1" level bit is stored in the memory cell 14, the input node voltage Vin initially is at the voltage Vx+Vt, which is lower than the voltage 1.5Vx+Vt on the bit line BL0. Accordingly, the bit line BL0 is discharged with current flow $i_{bl}$ in the direction of the arrow 34, increasing the input voltage Vin at the gate of the storage transistor. The increase in the input voltage Vin is amplified by the amplifier circuit 32, causing the output voltage Vout to decrease sharply.

The current $i_c$ flowing through the storage node capacitor $C_{dg}$ is given by the relationship:

$$i_c = C_{dg} dV/dt \qquad (3)$$

The current flowing $i_c$ through the storage node capacitor $C_{dg}$ depends on the drain-to-gate capacitance $C_{dg}$ and on the time rate of change of the voltage across the storage node capacitor. Accordingly, because the input voltage Vin is increasing and the output voltage Vout is decreasing sharply, the current through the storage node capacitor $C_{dg}$ is amplified due to effective Miller multiplication of the storage node capacitance. The larger current causes the bit line BL0 to discharge much quicker, resulting in a much larger signal from the memory cell.

It can be shown that the gain of the memory cells, such as memory cell 14, in reading a logic "1" level bit, i.e., when Vin=Vx+Vt, is:

$$A_{cell}=gmR=2[Vdd-(Vx+Vt)]/Vx \qquad (4)$$

This represents the effective multiplication of the storage node capacitance which can be a large quantity. The larger drop in the voltage on the bit line BL0 appears as if the storage node capacitance is much larger than the actual value.

Figure 3C:
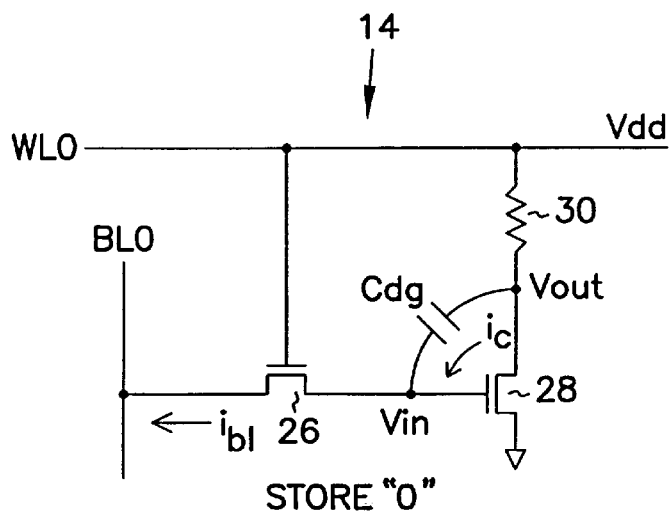

Referring now to FIG. 3C, when a logic "0" cell, then when the in the memory cell, then when the memory cell 14 is addressed, the internal input node is at a higher voltage than the bit line BL0 which is precharged to the voltage 1.5Vx+Vt This results in the storage node capacitor discharging into the bit line BL0, and increasing the voltage on the bit line BL0, with current flow $i_{bl}$ in the direction of the arrow 36. There is also a Miller effect multiplication of the current, tending to charge the bit line BL0, but the gain is slightly lower in this case. When the full level write voltage 2Vx+Vt is used, the gain falls off because the gain is dependent upon the bias voltages. When the voltage at the gate of transistor 28 is at the highest or lowest levels, the gain of the memory cell falls off. When the voltage at the gate is at an intermediate level, the memory cell has maximum gain. The drain-to-gate capacitance is made artificially large as indicated above and then amplified by an order of magnitude or more. However, the Miller effect multiplication results in a larger increase in the voltage on the bit line BL0 and the output signal provided by the memory cell.

In either case, a larger output signal is provided by the memory cell which is easier to detect. Stated in another way, by using Miller effect multiplication according to the invention, a much smaller storage node capacitor can be used to provide the same output signal, resulting in a much higher density for the memory device.

Thus, it has been shown that the invention provides a memory cell for a dynamic random access memory device which uses effective Miller multiplication of the storage node capacitance. This results in the production of larger currents during read operations which causes the bit line to discharge much quicker, resulting in a much larger signal from the memory cell. Therefore, in producing an output of a given amplitude, the memory cell provided by the invention can employ a smaller storage node capacitor, with a corresponding reduction in space on the integrated circuit structure. Consequently, the memory cell arrangement provided by the invention allows much higher density memories to be constructed.

What is claimed is:

1. A method of using a memory cell, the method comprising:

coupling a bit line to a storage capacitance between amplifier input and output terminals;

connecting the amplifier output terminal to a word line; and amplifying a resulting current through the storage capacitance to amplify a voltage of the bit line toward a logic level.

2. The method of claim 1, wherein the step of amplifying the resulting current includes Miller-effect multiplication of the storage capacitance.

3. The method of claim 1, further comprising the step of precharging the bit line to a read voltage level before coupling the bit line to the storage capacitance.

4. The method of claim 3, wherein the step of coupling the bit line to the storage capacitance includes the step of turning on an access transistor.

5. The method of claim 4, in which the step of coupling the amplifier output terminal to a word line includes coupling the word line to the access transistor.

6. The method of claim 5, wherein the step of turning on the access transistor includes driving the word line to approximately twice the read voltage level of the precharged bit line.

7. The method of claim 6, further comprising the step of writing data to the memory cell by providing a voltage, different from the read voltage, to the bit line, then coupling the bit line through the access transistor to the storage capacitance.

8. The method of claim 7, wherein the voltage provided to the bit line is approximately equal to a ground reference voltage level.

9. The method of claim 7, wherein the voltage provided to the bit line is approximately equal to a positive supply voltage level.

10. A memory cell comprising:

a word line for addressing the memory cell;

a bit line for communicating data to and from the memory cell;

an amplifier, having an input connected to the bit line, an output connected to the word line, and an effective storage capacitance that is magnified by a gain of the amplifier; and an access transistor interposed between the bit line and the amplifier input, and controlled by the word line.

11. The memory cell of claim 10, wherein the amplifier includes a transistor with which the storage capacitance is integrally formed.

12. The memory cell of claim 11, wherein the transistor is a field-effect transistor and the storage capacitance is a drain-gate overlap capacitance.

13. A memory cell comprising:

a word line for addressing the memory cell;

a bit line for writing data to and reading data from the memory cell;

an amplifier, including a common source field-effect transistor (FET) having a gate input terminal, a source terminal coupled to a reference potential, and a drain terminal connected to the word line through a resistor, and an integrally formed storage capacitance, between the gate and drain terminals, having an effective capacitance value at the gate terminal that is magnified by a gain of the amplifier; and an access FET coupling the gate input terminal of the common source FET to the bit line.

* * * * *

UNITED STATES PATENT AND TRADEMARK OFFICE
CERTIFICATE OF CORRECTION

PATENT NO. : 5,835,403
DATED : Nov. 10, 1998
INVENTOR(S) : Leonard Forbes

It is certified that error appears in the above-identified patent and that said Letters Patent is hereby corrected as shown below:

At Col. 3, line 22, please delete "the" following "are".

At Col. 5, lines 19-20, please delete "logic "0" cell, then when the in the memory cell" and insert --level bit is stored in the memory cell,--.

At Col. 5, line 23, please delete "1.5Vx+Vt" and insert --1.5Vx+Vt.--

Signed and Sealed this

Thirtieth Day of November, 1999

Attest:

Q. TODD DICKINSON

Attesting Officer

Acting Commissioner of Patents and Trademarks